(12) United States Patent
Takeuchi et al.

(10) Patent No.: US 9,002,021 B2
(45) Date of Patent: Apr. 7, 2015

(54) AUDIO CONTROLLING APPARATUS, AUDIO CORRECTION APPARATUS, AND AUDIO CORRECTION METHOD

(75) Inventors: Hirokazu Takeuchi, Machida (JP); Hiroshi Yonekubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 436 days.

(21) Appl. No.: 13/415,513

(22) Filed: Mar. 8, 2012

(65) Prior Publication Data
US 2012/0328114 A1 Dec. 27, 2012

(30) Foreign Application Priority Data
Jun. 24, 2011 (JP) .................. 2011-141099

(51) Int. Cl.
*H03G 3/20* (2006.01)
*H03G 3/00* (2006.01)
*H03G 9/00* (2006.01)

(52) U.S. Cl.
CPC ..................... *H03G 9/005* (2013.01)

(58) Field of Classification Search
CPC ......... H03G 3/32; H03G 3/3005; H03G 3/20; H03G 3/3089; H03G 3/301; H03G 3/30; H03G 9/025; H03G 7/00; H03G 7/002; H03G 7/007; H03G 5/165; H03G 5/005; H03G 11/008; H04S 7/307
USPC ............ 381/107, 56–57, 103–104, 94.1, 71.1
See application file for complete search history.

(56) References Cited

U.S. PATENT DOCUMENTS

| 4,553,104 A | * | 11/1985 | Olsen .......................... 330/129 |
| 7,013,011 B1 | * | 3/2006 | Weeks et al. .................. 381/98 |
| 7,664,197 B2 | | 2/2010 | Saito et al. |
| 7,991,171 B1 | * | 8/2011 | Snow .......................... 381/102 |
| 2002/0159605 A1 | * | 10/2002 | Yoshino et al. ............. 381/94.1 |
| 2004/0019481 A1 | | 1/2004 | Saito |
| 2009/0070106 A1 | * | 3/2009 | Gao et al. ..................... 704/225 |
| 2009/0092207 A1 | * | 4/2009 | Takahashi ..................... 375/345 |
| 2009/0190772 A1 | | 7/2009 | Osada |

(Continued)

FOREIGN PATENT DOCUMENTS

| JP | 2005-286789 | 10/2005 |
| JP | 2008-292802 | 12/2008 |
| JP | 2009-109791 | 5/2009 |
| JP | 2009-175420 | 8/2009 |
| JP | 2010-092057 | 4/2010 |
| JP | 2010-154388 | 7/2010 |
| JP | 2010-212898 | 9/2010 |
| JP | 2011-065093 | 3/2011 |

OTHER PUBLICATIONS

European Application No./Patent No.—12152044.9-1233, Extended European Search Report, mailed Aug. 8, 2012.
Japanese Patent Application No. 2011-141099, First Office Action, mailed Mar. 13, 2012, (with English Translation).

*Primary Examiner* — Xu Mei
(74) *Attorney, Agent, or Firm* — Blakely, Sokoloff, Taylor & Zafman LLP

(57) ABSTRACT

According to one embodiment, audio controlling apparatus includes first receiver configured to receive audio signal, second receiver configured to receive environmental sound, masking gain calculator configured to calculate masking gain for each frequency band, based on audio signal and environmental sound, and gain controller configured to smooth masking gain of frequency band that is less than preset threshold frequency in first interval, smooth masking gain of frequency band that is equal to or higher than threshold frequency in second interval that is longer than first interval, and thereby set gain.

7 Claims, 8 Drawing Sheets

(56) References Cited

U.S. PATENT DOCUMENTS

| | | | |
|---|---|---|---|
| 2010/0020986 A1* | 1/2010 | Nemer et al. | 381/94.1 |
| 2010/0166225 A1* | 7/2010 | Watanabe et al. | 381/107 |
| 2010/0202631 A1* | 8/2010 | Short | 381/104 |
| 2010/0246849 A1 | 9/2010 | Sudo et al. | |
| 2011/0071837 A1 | 3/2011 | Yonekubo et al. | |

* cited by examiner

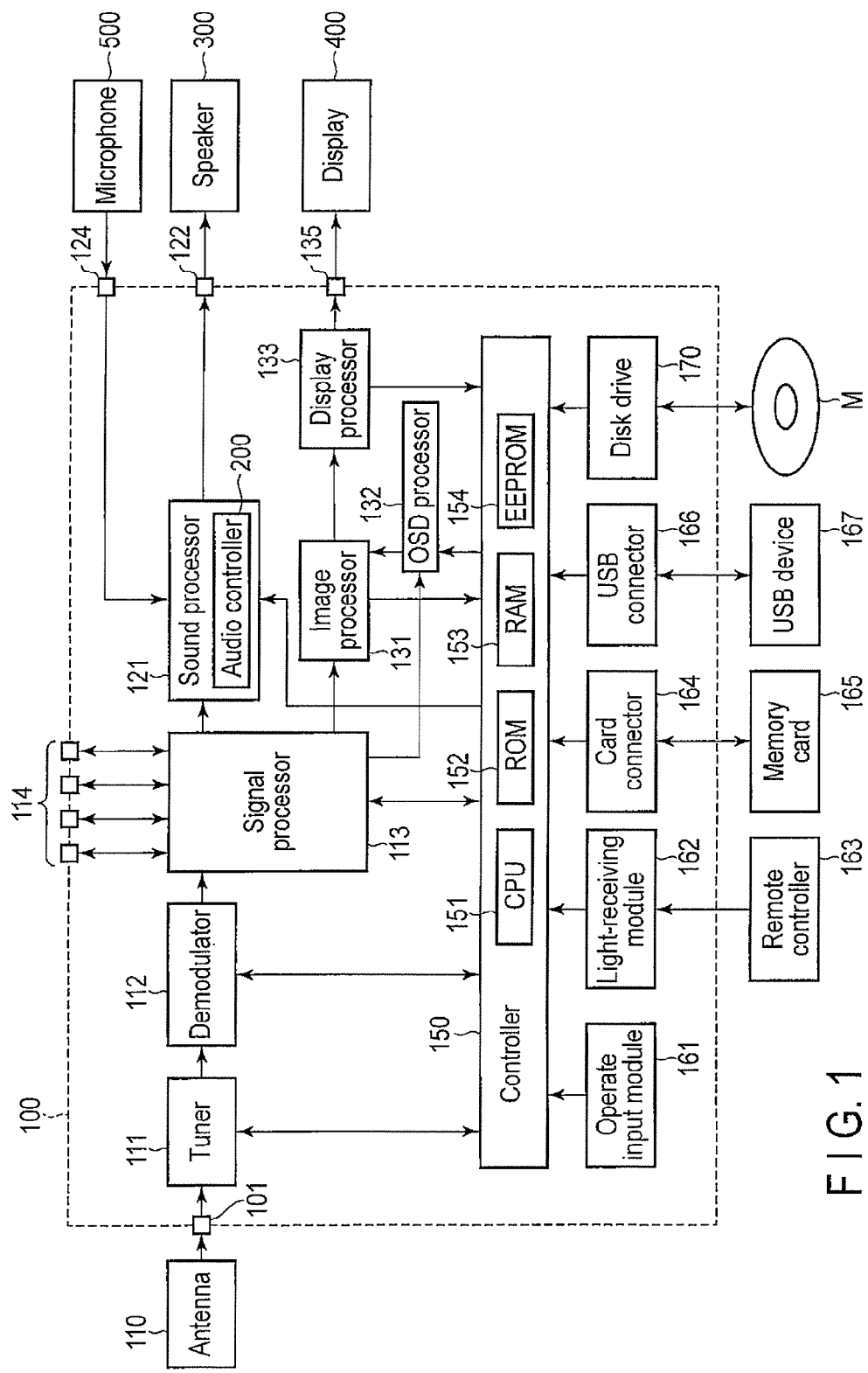
F I G. 1

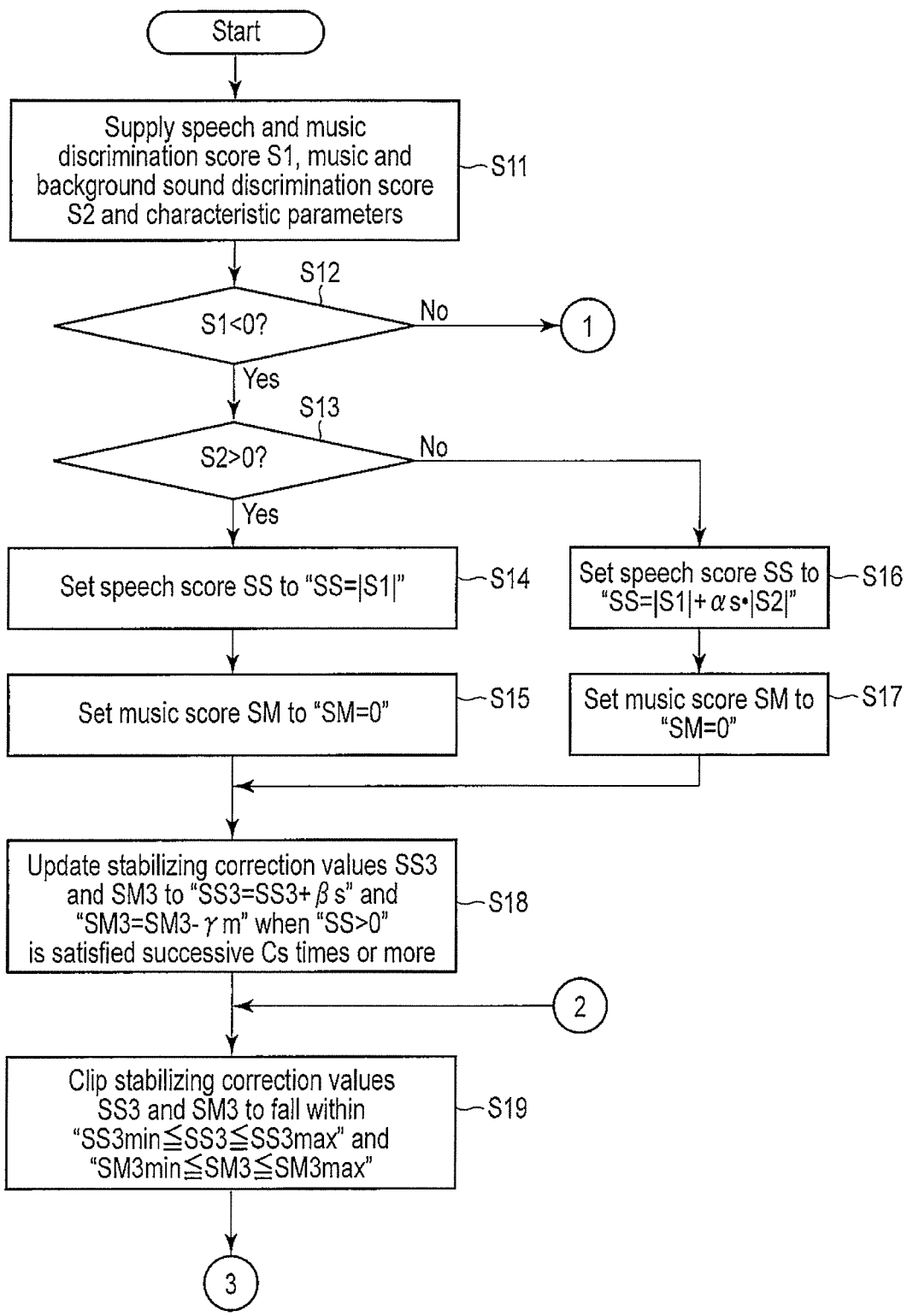
F I G. 4

AUDIO CONTROLLING APPARATUS, AUDIO CORRECTION APPARATUS, AND AUDIO CORRECTION METHOD

CROSS-REFERENCE TO RELATED APPLICATIONS

This application is based upon and claims the benefit of priority from prior Japanese Patent Application No. 2011-141099, filed Jun. 24, 2011, the entire contents of which are incorporated herein by reference.

FIELD

Embodiments described herein relate generally to an audio controlling apparatus, an audio correction apparatus, and an audio correction method.

BACKGROUND

In prior art, audio correction apparatuses which performs correction for audio signals and thereby can achieve increase in sound quality are generally known. The audio correction apparatuses detect, for example, a surrounding background noise (environmental sound), and performs sound volume control and equalizing processing according to the frequency for the audio signal, based on the detected environmental sound.

When the environmental sound is reduced, the audio correction apparatuses return the audio signal to its original state. Specifically, when the environmental sound is reduced, the audio correction apparatuses correct the audio signal to reduce the volume. Audio correction apparatuses of prior art perform correction to uniformly return the audio characteristics of the audio signal to the original state. In such a case, however, the audio correction apparatuses have the problem that the user may perceive "blur (lack of high register)" in hearing.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary view showing for explaining a broadcasting receiver according to an embodiment.

FIG. 4 is an exemplary view showing for explaining processing performed by the audio controller according to the embodiment.

DETAILED DESCRIPTION

Figure 2:
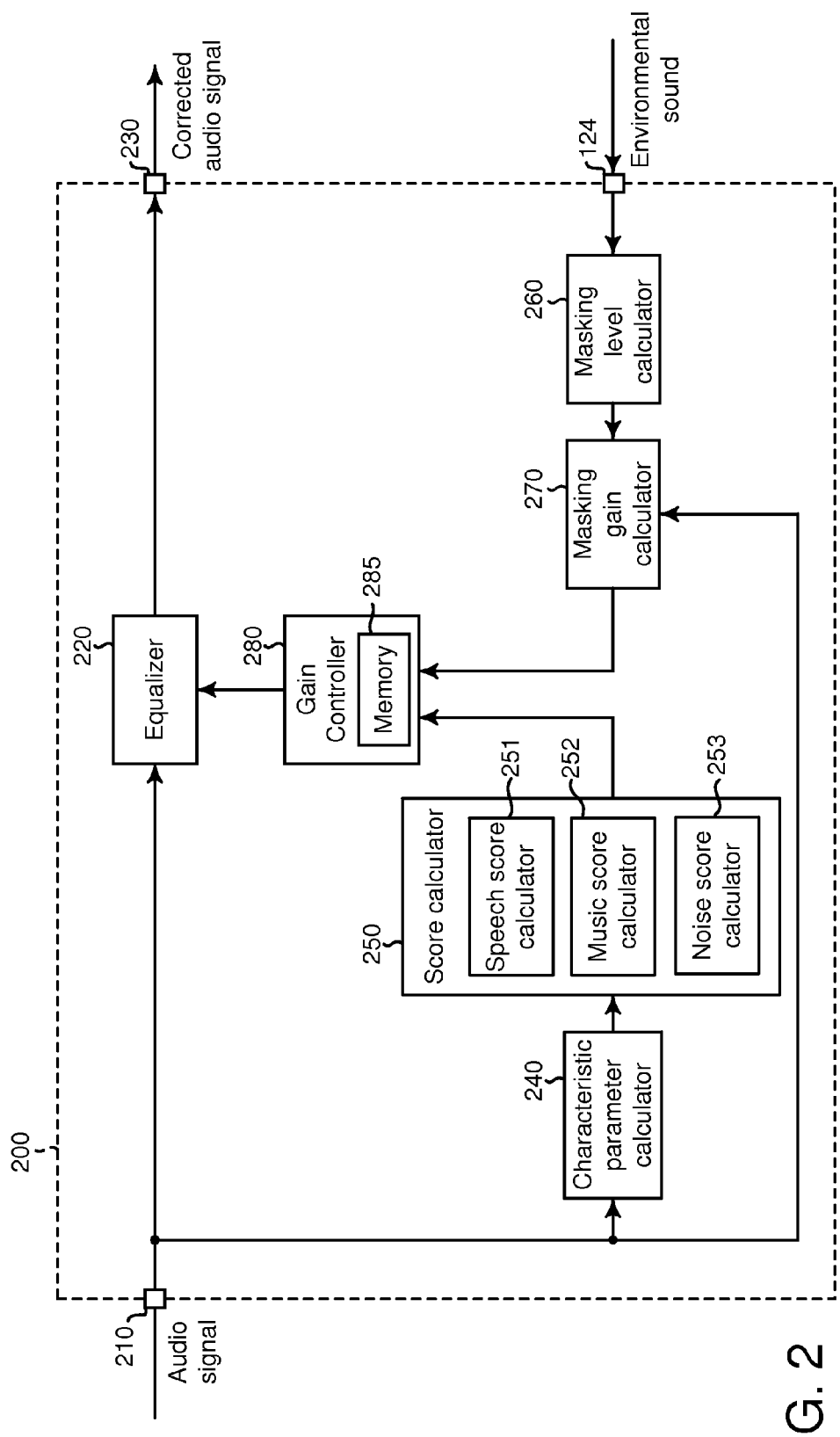
FIG. 2 is an exemplary view showing for explaining an audio controller according to the embodiment.

Various embodiments will be described hereinafter with reference to the accompanying drawings. In general, according to one embodiment, an audio controlling apparatus which is connected to an audio correction apparatus that includes an audio correction module that corrects an audio signal, the audio controlling apparatus comprises: a first receiver configured to receive the audio signal; a second receiver configured to receive an environmental sound; a masking gain calculator configured to calculate a masking gain for each frequency band, based on the audio signal and the environmental sound; a first gain controller configured to smooth the masking gain of a frequency band that is less than a preset threshold frequency in a first interval, smooth the masking gain of a frequency band that is equal to or higher than the threshold frequency in a second interval that is longer than the first interval, and thereby set a gain; and an output module configured to output the gain that is set by the first gain controller to the audio correction module of the audio correction apparatus.

An audio controlling apparatus, an audio correction apparatus, and an audio correction method according to an embodiment will be explained in detail hereinafter with reference to drawings.

FIG. 1 illustrates an example of a broadcasting receiver 100 according to an embodiment.

In the present embodiment, suppose that the broadcasting receiver 100 displays an image on a liquid crystal display device based on content.

The broadcasting receiver 100 comprises a broadcasting input terminal 101, a tuner 111, a demodulator 112, a signal processor 113, a communication interface 114, a sound processor 121, a sound output terminal 122, an environmental sound input terminal 124, an image processor 131, an OSD processor 132, a display processor 133, an image output terminal 135, a controller 150, an operation input module 161, a light-receiving module 162, a card connector 164, a USB connector 166, and a disk drive 170.

The broadcasting input terminal 101 is an input terminal, to which digital broadcasting signals that are received by, for example, an antenna 110 is inputted. The antenna 110 receives, for example, ground-wave digital broadcasting signals, BS (broadcasting satellite) digital broadcasting signals, and/or 110° CS (communication satellite) digital broadcasting signals. Specifically, contents such as programs that are supplied by broadcasting signals are inputted to the broadcasting input terminal 101.

The broadcasting input terminal 101 supplies the received digital broadcasting signals to the tuner 111. The tuner 111 is a digital broadcasting signal tuner. The tuner 111 performs tuning (selection) of the digital broadcasting signals supplied from the antenna 110. The tuner 111 transmits a tuned digital broadcasting signal to the demodulator 112.

The demodulator 112 demodulates the received digital broadcasting signal. The demodulator 112 inputs the demodulated digital broadcasting signal (content) to the signal processor 113. Specifically, the antenna 110, the tuner 111, and the demodulator 112 function as receiving means for receiving content.

The signal processor 113 functions as signal processing means for performing signal processing for the digital broadcasting signal (moving-image content data). The signal processor 113 performs signal processing for the digital broadcasting signal supplied from the demodulator 112. Specifically, the signal processor 113 divides the digital broadcasting signal into an image signal, a sound signal, and another data signal. The signal processor 113 supplies the sound signal to the sound processor 121. In addition, the signal processor 113 supplies the image signal to the image processor 131. The signal processor 113 also supplies the data signal to the controller 150 and/or the OSD processor 132.

The communication interface 114 includes an interface, such as an HDMI (High Definition Multimedia Interface), which can receive content. The communication interface 114 receives multiplex content, which includes a digital image signal and a digital sound signal, from another apparatus. The communication interface 114 supplies a digital signal (content) received from another apparatus to the signal processor 113. Specifically, the communication interface 114 functions as receiving means for receiving content.

The signal processor 113 performs signal processing for the digital signal that is received from the communication interface 114. For example, the signal processor 113 divides the digital signal into a digital image signal, a digital sound signal, and a data signal. The signal processor 113 supplies the digital sound signal to the sound processor 121. In addition, the signal processor 113 supplies the digital image signal to the image processor 131. The signal processor 113 also supplies the data signal to the controller 150 and/or the OSD processor 132.

The signal processor 113 selects one of the content which is inputted to the communication interface 114, and the content which is inputted to the broadcasting input terminal 101, and performs signal processing for the selected content. Specifically, the signal processor 113 performs signal dividing processing for one of the digital broadcasting signal and the digital signal.

The sound processor 121 converts the digital sound signal received from the signal processor 113 into a signal (audio signal) of a format which can be played back by a speaker 300. The sound processor 121 outputs the audio signal to the sound output terminal 122. The sound output terminal 122 outputs the supplied audio signal to the outside of the apparatus. Thereby, the speaker 300 which is connected to the sound output terminal 122 plays back sound based on the supplied audio signal.

The audio signal includes various types of sounds according to the content. For example, the audio signal such as a TV program includes a signal based on a speech (speech) generated by a person, music (music), and various noises (background noise). The noise in this case includes, for example, applause, cheers, and other various noises.

The environmental sound input terminal 124 is a terminal to which a device which detects sound, such as a microphone 500, is connected. The microphone 500 is provided in the vicinity of the broadcasting receiver 100, detects surrounding sound (background noise) around the broadcasting receiver 100, and converts the sound into a signal. The microphone 500 supplies the signal to the environmental sound input terminal 124. The environmental sound input terminal 124 supplies the signal supplied from the microphone 500 as environmental sound to the sound processor 121.

The image processor 131 converts an image signal received from the signal processor 113 into an image signal of a format which can be played back by a display 400. Specifically, the image processor 131 decodes (plays back) the image signal received from the signal processor 113 into an image signal of a format which can be played back by the display 400. In addition, the image processor 131 superposes the OSD signal which is supplied from the OSD processor 132 on the image signal. The image processor 131 outputs the image signal to the display processor 133.

The OSD processor 132 generates an OSD signal to display a GUI (Graphic User Interface) picture, subtitles, time, and other information on the screen, based on the data signal supplied from the signal processor 113, and/or the control signal supplied from the controller 150.

The display processor 133 performs image quality control processing for color, brightness, sharpness, contrast, and other properties, for the received image signal, based on control from the controller 150. The display controller 133 outputs the image signal which has been subjected to image quality control to the image output terminal 135. Thereby, the display 400 which is connected to the image output terminal 135 displays an image based on the supplied image signal.

The display 400 includes, for example, a liquid crystal display device which includes a liquid crystal display panel that includes a plurality of pixels that are arranged in rows and columns, and a backlight that illuminates the liquid crystal panel. The display 400 displays an image based on the image signal supplied from the broadcasting receiver 100.

The broadcasting receiver 100 may have a structure in which the display 400 is included in the receiver, instead of the image output terminal 135. The broadcasting receiver 100 may have a structure in which the speaker 300 is included in the receiver, instead of the sound output terminal 122.

The controller 150 functions as control means for controlling operations of the modules in the broadcasting receiver 100. The controller 150 includes a CPU 151, a ROM 152, a RAM 153, and an EEPROM 154. The controller 150 performs various processing, based on an operation signal supplied from the operation input module 161.

The CPU 151 includes an operation unit which executes various operation processing. The CPU 151 realizes various functions by executing programs stored in the ROM 152 or the EEPROM 154.

The ROM 152 stores a program to control the broadcasting receiver 100, and programs to execute various functions. The CPU 151 starts a program stored in the ROM 152, based on an operation signal supplied from the operation input module 161. Thereby, the controller 150 controls operations of the modules.

The RAM 153 functions as a work memory of the CPU 151. Specifically, the RAM 153 stores an operation result of the CPU 151, and data read by the CPU 151.

The EEPROM 154 is a nonvolatile memory which stores various setting information items and programs.

The operation input module 161 is input means which includes operation keys, a keyboard, a mouse, a touch pad, or another input device which can generate an operation signal in response to an operation. For example, the operation input module 161 generates an operation signal in response to an operation. The operation input module 161 supplies the generated operation signal to the controller 150.

The touch pad includes an electrostatic sensor, a thermo sensor, or a device which generates positional information based on another method. When the broadcasting receiver 100 includes the display 400, the operation input module 161 may have a structure of including a touch panel which is formed as one unitary piece with the display 400.

The light-receiving module 162 includes, for example, a sensor which receives an operation signal from a remote controller 163. The light-receiving module 162 supplies the received operation signal to the controller 150. The remote controller 163 generates an operation signal based on a user's operation. The remote controller 163 transmits the generated operation signal to the light-receiving module 162 by infrared communication. The light-receiving module 162 and the remote controller 163 may have a structure of performing transmission/reception of the operation signal by another wireless communication such as radio communication.

The card connector 164 is an interface to perform communication with, for example, a memory card 165 which stores moving-image content. The card connector 164 reads out moving-image content data from the connected memory card 165, and supplies the content data to the controller 150.

The USB connector 166 is an interface to perform communication with a USE device 167. The USB connector 166 supplies a signal supplied from the connected USB device 167 to the controller 150.

For example, when the USB device 167 is an operation input device such as a keyboard, the USB connector 166 receives an operation signal from the USB device 167. The USE connector 166 supplies the received operation signal to the controller 150. In this case, the controller 150 executes various processing, based on the operation signal supplied from the USB connector 166.

In addition, for example, when the USB device 167 is a storage device which stores moving-image content data, the USB connector 166 can obtain the content from the USB device 167. The USB connector 166 supplies the obtained content to the controller 150.

The disk drive 170 includes a drive to which an optical disk M, such as a compact disk (CD), a digital versatile disk (DVD), a Blu-ray disk (registered trademark), and another optical disk which can store moving-image content data, can be attached. The disk drive 170 reads out content from the attached optical disk M, and supplies the read content to the controller 150.

The broadcasting receiver 100 also includes a power source (not shown). The power source supplies electric power to the modules of the broadcasting receiver 100. The power source converts electric power which is supplied through an AC adaptor or the like, and supplies the electric power to the modules. The power source may include a battery. In such a case, the power source charges the battery with electric power supplied through the AC adaptor or the like. The power source supplies the electric power stored in the battery to the modules of the broadcasting receiver 100.

The broadcasting receiver 100 may also include another interface. The interface is, for example, a Serial-ATA, or a LAN port. The broadcasting receiver 100 can obtain and play back content which is stored in a device that is connected by the interface. The broadcasting receiver 100 can output a played-back audio signal and image signal to a device connected by the interface.

When the broadcasting receiver 100 is connected to a network through the interface, the broadcasting receiver 100 can obtain and play back moving-image content data on the network.

In addition, the broadcasting receiver 100 may include a storage device such as a hard disk (HDD), a solid state disk (SOD), and a semiconductor memory. When the storage device stores moving-image content data, the broadcasting receiver 100 can read out and play back the content stored in the storage device. Besides, the broadcasting receiver 100 can store a broadcasting signal, or content supplied by a network or the like, in the storage device.

The sound processor 121 includes an audio controller 200. The audio controller 200 corrects an audio signal played back by the sound processor 121. Thereby, the audio controller 200 controls the audio signal such that sound which can be heard more easily for the user is played back from the speaker 300. For example, the audio controller 200 can correct the playback audio signal for each frequency, based on the environmental sound supplied from the environmental sound input terminal 124 and the playback audio signal.

FIG. 2 illustrates an example of the audio controller 200 illustrated in FIG. 1.

As illustrated in FIG. 2, the audio controller 200 includes an input terminal 210, an equalizer 220, an output terminal 230, a characteristic parameter calculator 240, a score calculator 250, a masking level calculator 260, a masking gain calculator 270, and a gain controller 280.

The audio controller 200 corrects the audio signal such that the audio signal is more easily heard by the user, based on the sound type of the audio signal and the characteristic of the environmental sound which is detected by the microphone 500 when the broadcasting receiver 100 plays back the audio signal. The environmental sound is a signal which is obtained by suppressing loop of sound outputted from the speaker 300 by an echo canceller or the like.

The input terminal 210 is receiving means for receiving an audio signal which is played back by the sound processor 121. The input terminal 210 supplies the received audio signal to the equalizer 220, the characteristic parameter calculator 240, and the masking gain calculator 270.

The equalizer 220 corrects the audio signal in accordance with a gain characteristic designated by the gain controller 280. The equalizer 220 transmits the corrected audio signal (corrected audio signal) to the output terminal 230. The equalizing processing includes sound volume control which corresponds to gain control over all the frequency bands.

The output terminal 230 outputs the corrected audio signal corrected by the equalizer 220. When the sound output terminal 122 is connected with the output terminal 230, the output terminal 230 outputs the corrected audio signal to the outside of the broadcasting receiver 100 through the sound output terminal 122. As a result, the speaker 300 connected to the sound output terminal 122 plays back sound based on the corrected audio signal.

Figure 3:
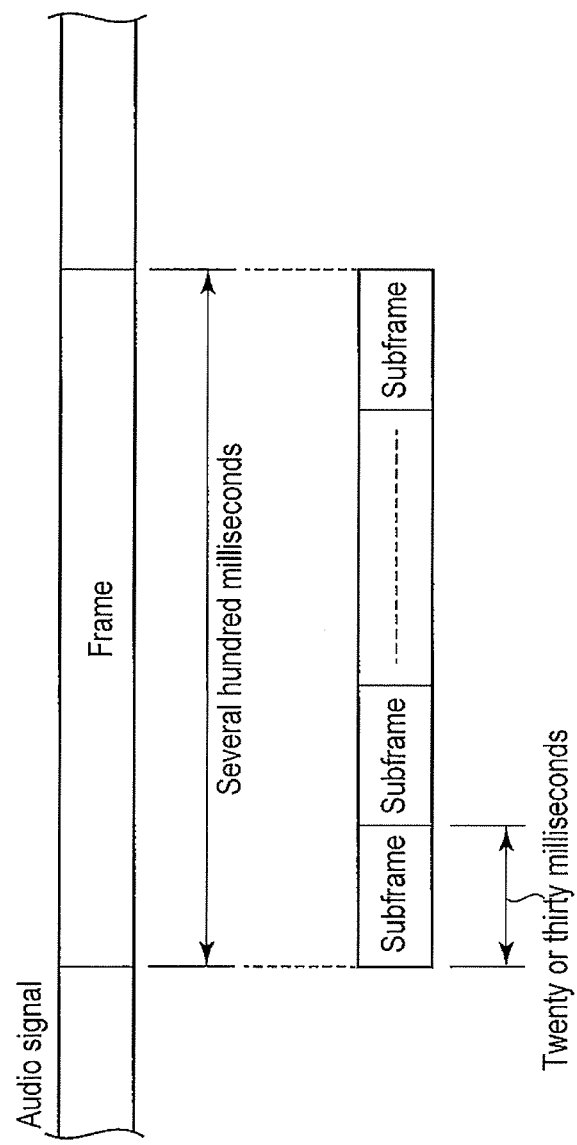
FIG. 3 is an exemplary view showing for explaining processing performed by the audio controller according to the embodiment.

The characteristic parameter calculator 240 calculates various characteristic parameters based on the audio signal. In this case, as illustrated in FIG. 3, the characteristic parameter calculator 240 divides the audio signal into a plurality of frames of several hundred milliseconds. The characteristic parameter calculator 240 further divides each frame into a plurality of subframes of twenty or thirty milliseconds.

The characteristic parameter calculator 240 calculates various characteristic parameters for each subframe. Therefore, the characteristic parameter calculator 240 obtains distinction information to generate various characteristic parameters for each subframe. The characteristic parameter calculator 240 calculates statistics of the obtained distinction information for each frame, and thereby calculates the characteristic parameters.

Specifically, the characteristic parameter calculator 240 obtains distinction information to distinguish the speech signal and the music signal for each subframe from the audio signal. In addition, the characteristic parameter calculator 240 obtains distinction information to distinguish the music signal from noise for each subframe from the audio signal.

The characteristic parameter calculator 240 also obtains various distinction information items to distinguish the speech and music signals from the noise signal for each subframe from the audio signal.

For example, the characteristic parameter calculator 240 calculates statistics (for example, average, distribution, maximum, and minimum) for each frame based on the obtained various distinction information items. Thereby, the characteristic parameter calculator 240 calculates various characteristic parameters.

For example, the characteristic parameter calculator 240 calculates various characteristic parameters to distinguish the speech signal from the music signal, based on the distinction information. In addition, the characteristic parameter calculator 240 calculates various characteristic parameters to distinguish the music signal from noise based on the distinction information. The characteristic parameter calculator 240 also calculates various characteristic parameters to distinguish the speech and music signals from the noise signal based on the distinction information.

For example, the characteristic parameter calculator 240 calculates a sum of squares (power value) of the signal amplitude of the audio signal for each subframe, as distinction information. The characteristic parameter calculator 240 calculates statistics for each frame based on the calculated power value, and thereby generates a characteristic parameter pw relating to the power value.

The characteristic parameter calculator 240 also calculates a zero-cross frequency of the audio signal for each subframe as distinction information. The zero-cross frequency is the number of times with which the audio signal crosses zero in the amplitude direction, when the horizontal axis indicates time and the vertical axis indicates amplitude. The characteristic parameter calculator 240 calculates statistics for each frame based on the calculated zero-cross frequency, and thereby generates a characteristic parameter zc relating to the zero-cross frequency.

In addition, the characteristic parameter calculator 240 calculates spectral variation in a frequency region of the audio signal for each subframe, as distinction information. The characteristic parameter calculator 240 calculates statistics for each frame based on the calculated spectral variation, and thereby generates a characteristic parameter sf relating to spectral variation.

The characteristic parameter calculator 240 also calculates a power ratio (LR power ratio) of left and right (LR) signals of 2-channel stereo in the audio signal for each subframe, as distinction information. The characteristic parameter calculator 240 calculates statistics for each frame based on the calculated LR power ratio, and thereby generates a characteristic parameter lr relating to the LR power ratio.

The characteristic parameter calculator 240 also calculates spectral flatness of the audio signal for each subframe, as distinction information. The characteristic parameter calculator 240 calculates statistics for each frame based on the calculated spectral flatness, and thereby generates a characteristic parameter SFM relating to the noise signal.

The characteristic parameter pw relating to the power value indicates a difference in signal power between subframes. For example, the characteristic parameter pw indicates distribution of the power value between subframes. When the main component of the audio signal is speech, the difference in signal power between subframes tends to be large. Specifically, when the main component of the audio signal is speech, the value of the characteristic parameter pw increases.

The characteristic parameter zc relating to the zero-cross frequency indicates variation of the number of times with which the audio signal crosses zero in the amplitude direction, when the horizontal axis indicates time and the vertical axis indicates amplitude, as described above. In the speech signal, the zero-cross frequency is high in a consonant, and the zero-cross frequency is low in a vowel. Specifically, when the main component of the audio signal is speech, distribution of the value of the characteristic parameter zc relating to the zero-cross frequency between subframes tends to increase.

The characteristic parameter sf relating to the spectral variation indicates spectral variation in the frequency region of the audio signal for each subframe, as described above. The speech signal has sharper variations in frequency characteristics than that of the music signal. Therefore, when the main component of the audio signal is speech, distribution of the characteristic parameter sf relating to the spectral variation tends to be large.

The characteristic parameter lr relating to the LR power ratio indicates a power ratio (LR power ratio) of left and right (LR) signals of 2-channel stereo in the audio signal for each subframe, as described above. In the music signal, performances of musical instruments other than the vocal are often localized other than the center. Therefore, when the main component of the audio signal is music, the power ratio between the left and right channels tends to increase.

The characteristic parameter SFM relating to the noise signal is a parameter based on the spectral flatness of the audio signal for each subframe, as described above. The noise signal tends to form a flat spectrum. Therefore, when the main component of the audio signal is noise, distribution of the audio signal between subframes tends to decrease.

The characteristic parameter calculator 240 supplies the generated various characteristic parameters to the score calculator 250.

The score calculator 250 calculates a speech and music discrimination score S1 which indicates whether the audio signal is close to speech or music, based on the various characteristic parameters supplied from the characteristic parameter calculator 240. The score calculator 250 also calculates a music and background sound discrimination score S2 which indicates whether the audio signal is close to music or background noise, based on the various characteristic parameters supplied from the characteristic parameter calculator 240.

The score calculator 250 includes a speech score calculator 251, a music score calculator 252, and a noise score calculator 253. The score calculator 250 calculates a speech score SS, a music score SM, and a noise score SN, by the speech score calculator 251, the music score calculator 252, and the noise score calculator 253, respectively. The score calculator 250 calculates the speech score SS, the music score SM, and the noise score SN, based on the speech and music discrimination score S1 and the music and background sound discrimination score S2. The score calculator 250 supplies the calculated speech score SS, the music score SM, and the noise score SN to the gain controller 280.

The masking level calculator 260 calculates a masking level, based on the environmental sound received by the environmental sound input terminal 124. The masking level calculator 260 supplies the calculated masking level to the masking gain calculator 270.

The masking gain calculator 270 calculates a masking gain Gm [k] for each frequency, based on the masking level supplied from the masking level calculator 260 and the audio signal. The masking gain calculator 270 supplies the calculated masking gain Gm [k] to the gain controller 280.

The gain controller 280 determines a gain G [k] for each frequency, based on the speech score SS, the music score SM, and the noise score SN which are supplied from the score calculator 250 and the masking gain Gm [k] supplied from the masking gain calculator 270. The gain controller 280 supplies the gain G [k] to the equalizer 220.

The equalizer 220 corrects the audio signal based on the gain G [k] supplied from the gain controller 280, as described above.

Next, operation of the score calculator 250 will be explained hereinafter in detail.

For example, the score calculator 250 calculates the speech and music discrimination score S1 and the music and background sound discrimination score S2, by using a linear discrimination function. However, the score calculator 250 may use any method other than the linear discrimination function.

The score calculator 250 stores in advance weight coefficients A and B to be multiplied by the various characteristic parameters which are necessary for calculating the speech and music discrimination score S1 and the music and background sound discrimination score S2. The weight coefficients of a larger (higher) value are provided for a characteristic parameter which has larger effect for identifying the sound type. Specifically, the weight coefficients A and B are stored in advance for each characteristic parameter used for calculation of the scores.

The score calculator 250 selects a plurality of characteristic parameters (characteristic parameter set) to be used for calculation of the speech and music discrimination score S1, from the various characteristic parameters calculated by the characteristic parameter calculator 240. The characteristic parameter set is represented by, for example, a vector x.

When the characteristic parameter set x includes n characteristic parameters, the speech and music discrimination score S1 is calculated by "$S1=A_0+A_1 \cdot x_1+A_2 \cdot x_2+ \ldots +A_n \cdot x_n$".

The score calculator 250 also selects a plurality of characteristic parameters (characteristic parameter set) to be used for calculation of the music and background sound discrimination score S2, from the various characteristic parameters calculated by the characteristic parameter calculator 240. The characteristic parameter set is represented by, for example, a vector y.

When the characteristic parameter set y includes m characteristic parameters, the music and background sound discrimination score S2 is calculated by "$S2=B_0+B_1 \cdot y_1+B_2 \cdot y_2+ \ldots +B_m \cdot y_m$".

The coefficient A is set such that the difference between the speech and music discrimination score S1 and 1.0 is minimum when the main component of the audio signal is music, and the difference between the speech and music discrimination score S1 and −1.0 is minimum when the main component of the audio signal is speech.

The coefficient B is set such that the difference between the music and background sound discrimination score S2 and 1.0 is minimum when the main component of the audio signal is music, and the difference between the music and background sound discrimination score S2 and −1.0 is minimum when the main component of the audio signal is background sound.

Figure 5:
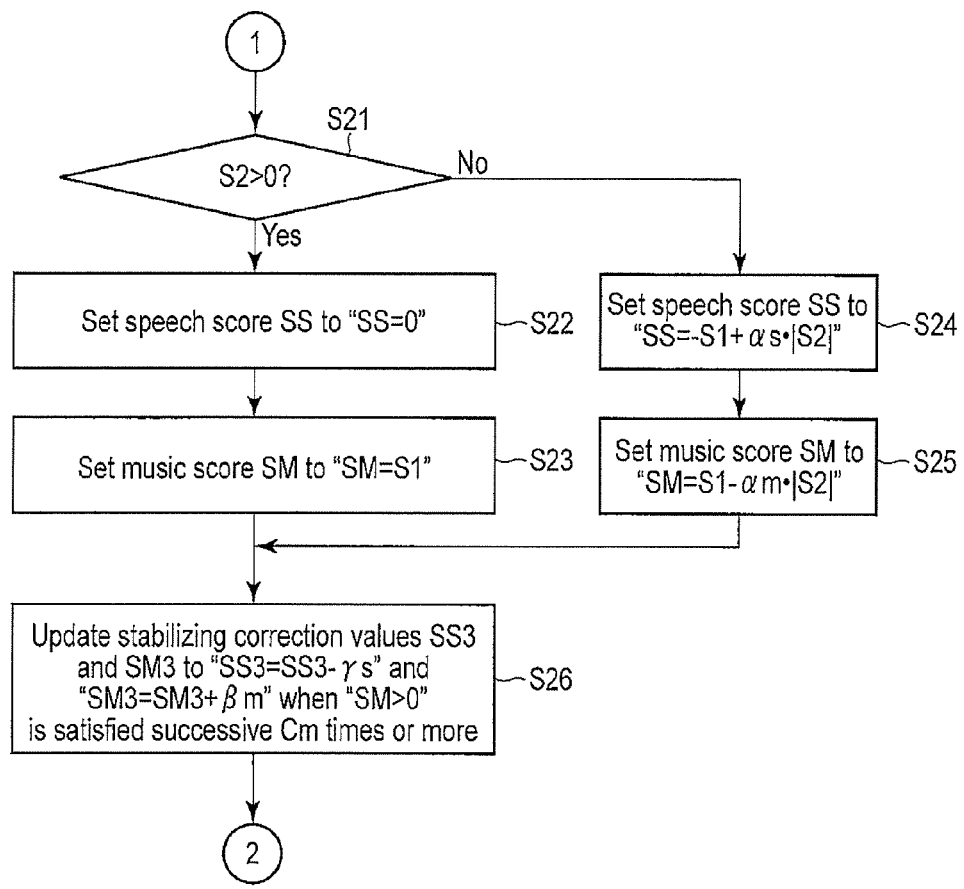
FIG. 5 is an exemplary view showing for explaining processing performed by the audio controller according to the embodiment.
Figure 6:
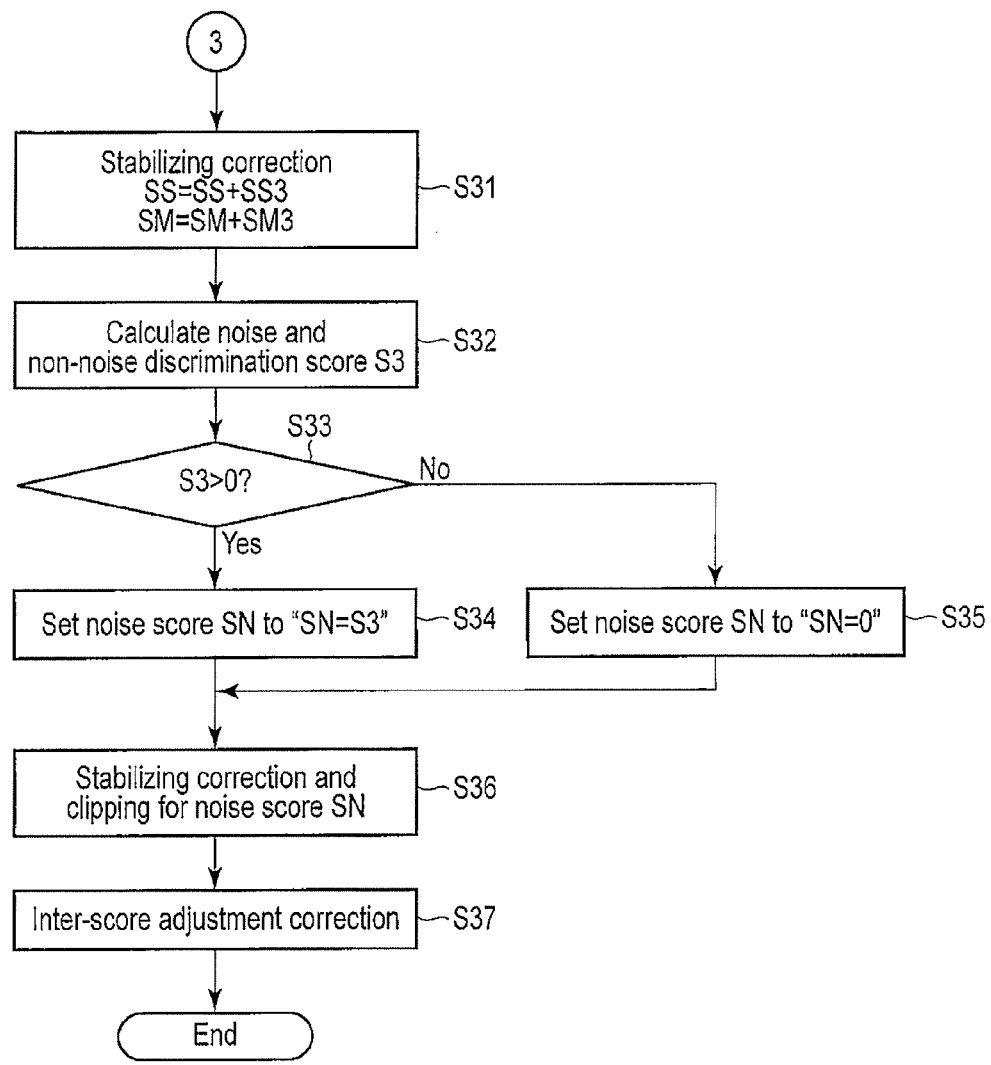
FIG. 6 is an exemplary view showing for explaining processing performed by the audio controller according to the embodiment.

FIG. 4 to FIG. 6 illustrate an example of processing performed by the audio controller 200.

The score calculator 250 calculates the speech and music discrimination score S1 and the music and background sound discrimination score S2, based on the various characteristic parameters supplied from the characteristic parameter calculator 240 (Step S11).

The score calculator 250 determines whether the speech and music discrimination score S1 is a negative number or not (Step S12). When it is determined at Step S12 that the speech and music discrimination score S1 is a negative number, the score calculator 250 determines whether the music and background sound discrimination score S2 is a positive number or not (Step S13).

When it is determined at Step S13 that the music and background sound discrimination score S2 is a positive number, the speech score calculator 251 of the score calculator 250 sets the speech score SS as the absolute value of the speech and music discrimination score S1 (Step S14). In addition, the music score calculator 252 of the score calculator 250 sets the music score SM to "0" (Step S15).

When it is determined at Step S13 that the music and background sound discrimination score S2 is not a positive number, the speech score calculator 251 of the score calculator 250 sets the speech score SS to "SS=|S1|+αs·|S2|" (Step S16). Specifically, the speech score calculator 251 adds a value obtained by correcting the absolute value of the music and background sound discrimination score S2 by a preset coefficient as to the absolute value of the speech and music discrimination score S1, to take the speech component included in the background noise included in the audio signal into consideration. In addition, the music score calculator 252 of the score calculator 250 sets the music score SM to "0" (Step S17).

The score calculator 250 updates correction values (stabilizing correction values) SS3 and SM3 to stabilize the speech score SS and the music score SM, respectively, which are calculated at Step S14 to Step S17 (Step S18). For example, when the speech score SS is a positive number (SS>0) successive Cs times or more, the score calculator 250 updates the stabilizing correction value SS3 and the stabilizing correction value SM3.

In this case, the score calculator 250 updates the stabilizing correction value SS3 to a value (SS3+βs) which is obtained by adding a preset predetermined stabilizing coefficient βs to the already calculated stabilizing correction value SS3, as a new stabilizing correction value SS3. In addition, the score calculator 250 updates the stabilizing correction value SM3 to a value (SM3−γm) which is obtained by subtracting a preset predetermined stabilizing coefficient γm from the already calculated stabilizing correction value SM3, as a new stabilizing correction value SM3.

When it is determined at Step S12 that the speech and music discrimination score S1 is not a negative number, the score calculator 250 goes to Step S21 of FIG. 5. The score calculator 250 determines whether the music and background sound discrimination score S2 is a positive number or not (Step S21).

When it is determined at Step S21 that the music and background sound discrimination score S2 is a positive number, the speech score calculator 251 of the score calculator 250 sets the speech score SS to "0" (Step S22). In addition, the music score calculator 252 of the score calculator 250 sets the music score SM as the speech and music discrimination score S1 (Step S23).

When it is determined at Step S21 that the music and background sound discrimination score S2 is not a positive number, the speech score calculator 251 of the score calculator 250 sets the speech score SS to "SS=−S1+αs·|S2|" (Step S24). Specifically, the speech score calculator 251 adds a value, which is obtained by correcting the absolute value of the music and background sound discrimination score S2 by a preset coefficient as, to a negative number (−S1) of the speech and music discrimination score S1, to take the speech component included in background noise included in the audio signal into consideration.

In addition, the music score calculator 252 of the score calculator 250 sets the music score SM to "SM=S1−αm·|S2|"

(Step S25). Specifically, the music score calculator 252 subtracts a value, which is obtained by correcting the absolute value of the music and background sound discrimination score S2 by a preset coefficient αm, from the speech and music discrimination score S1, to take the music component included in background noise included in the audio signal into consideration.

The score calculator 250 updates the correction values (stabilizing correction values) SS3 and SM3 to stabilize the speech score SS and the music score SM calculated at Step S22 to Step S25 (Step S26). For example, when the music score SM is a positive number (SM>0) successive Cm times or more, the score calculator 250 updates the stabilizing correction value SS3 and the stabilizing correction value SM3.

In this case, the score calculator 250 updates the stabilizing correction value SS3 to a value (SS3−γs) which is obtained by subtracting a preset predetermined stabilizing coefficient γs from the already calculated stabilizing correction value SS3, as a new stabilizing correction value SS3. In addition, the score calculator 250 updates the stabilizing correction value SM3 to a value (SM3+βm) which is obtained by adding a preset predetermined stabilizing coefficient βm to the already calculated stabilizing correction value SM3, as a new stabilizing correction value SM3.

In addition, the score calculator 250 clips the stabilizing correction value SS3 and the stabilizing correction value SM3 updated at Step S18 of FIG. 4 and Step S26 of FIG. 5 (Step S19). Thereby, the score calculator 250 controls the stabilizing correction value SS3 and the stabilizing correction value SM3 to fall within a predetermined range. For example, the score calculator 250 performs control such that the stabilizing correction value SS3 has a value which falls within a range "SS3min≤SS3≤SS3max". In addition, for example, the score calculator 250 performs control such that the stabilizing correction value SM3 has a value which falls within a range "SM3min≤SM3≤SM3max".

Then, the score calculator 250 goes to Step S31 of FIG. 6. The score calculator 250 stabilizes the speech score SS and the music score SM, based on the stabilizing correction value SS3 and the stabilizing correction value SM3 clipped at Step S26 (Step S31). For example, the score calculator 250 adds the stabilizing correction value SS3 to the already calculated speech score SS. The score calculator 250 also adds the stabilizing correction value SM3 to the already calculated music score SM.

The score calculator 250 calculates a noise and non-noise discrimination score S3 (Step S32). For example, the score calculator 250 calculates statistics of the characteristic parameter SFM, and thereby generates the noise and non-noise discrimination score S3. In this case, the score calculator 250 calculates the noise and non-noise discrimination score S3, based on the spectral flatness for each of a plurality of frequency bands (low frequency band, middle frequency band, high frequency band).

The score calculator 250 determines whether the noise and non-noise discrimination score S3 is a positive number or not (Step S33). When it is determined at Step S33 that the noise and non-noise discrimination score S3 is a positive number, the noise score calculator 253 of the score calculator 250 sets the noise score SN as the noise and non-noise discrimination score S3 (Step S34).

When it is determined at Step S33 that the noise and non-noise discrimination score S3 is not a positive number, the noise score calculator 253 of the score calculator 250 sets the noise score SN to "0" (Step S35).

In addition, the score calculator 250 performs stabilizing correction and clipping for the noise score SN set at Step S36 (Step S36).

The score calculator 250 performs inter-score adjustment correction (Step S37). Specifically, the score calculator 250 adjusts balance between the speech score SS, the music score SM, and the noise score SN. For example, when the music score SM and the noise score SN are larger than preset values, the score calculator 250 corrects the music score SM to reduce the music score SM in accordance with the noise score SN.

The score calculator 250 supplies the speech score SS, the music score SM, and the noise score SN calculated by the above method to the gain controller 280.

Next, operation of the masking level calculator 260 and the masking gain calculator 270 will be explained in detail hereinafter.

The masking level calculator 260 calculates a noise masking level, based on the environmental sound received by the environmental sound input terminal 124 and a frequency masking characteristic which is generally determined as auditory characteristic. The frequency masking characteristic is obtained by numerically expressing a signal level at which a sound around (both the high and low frequency bands) the frequency component cannot be heard on the frequency region for a sound, as human auditory characteristic. For example, the masking level calculator 260 performs time-frequency conversion for a signal of the environmental sound, and thereby calculates a frequency characteristic of the environmental sound. The masking level calculator 260 superposes the above masking characteristic on each frequency component of the environmental sound, and thereby calculates the masking level of the whole environmental sound. The masking level calculator 260 supplies the calculated masking level to the masking gain calculator 270.

The masking gain calculator 270 calculates a masking gain Gm [k] for each frequency, based on the masking level supplied from the masking level calculator 260 and the audio signal. Thereby, the masking level calculator 270 calculates a masking gain Gm [k] to perform gain correction for the audio signal such that the audio signal is not buried in the environmental sound.

Figure 7:
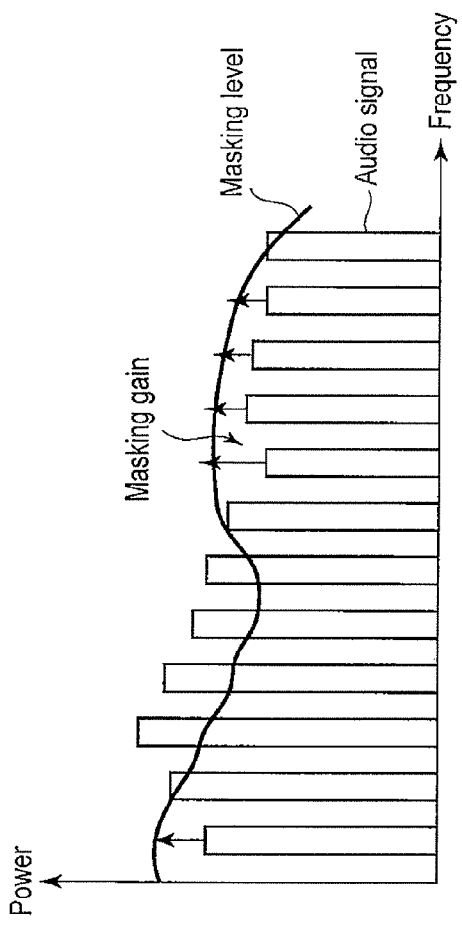
FIG. 7 is an exemplary view showing for explaining processing performed by the audio controller according to the embodiment.

For example, the masking gain calculator 270 supplies the calculated masking gain Gm [k] to the gain controller 280. As illustrated in FIG. 7, the masking gain calculator 270 superposes the masking level on the frequency characteristic of (power) of the audio signal. The masking gain calculator 270 calculates a gain (masking gain Gm [k]) to correct the frequency characteristic of the audio signal to a value not less than the masking level, for each frequency band. The masking gain calculator 270 supplies the calculated masking gain Gm [k] to the gain controller 280.

The reference symbol k denotes an index of the frequency band. The masking gain calculator 270 may have a structure of performing clipping or time smoothing processing, if necessary, to prevent excessive gain and rapid change in gain in the time-domain.

Next, operation of the gain controller 280 will be explained in detail hereinafter.

Figure 8:
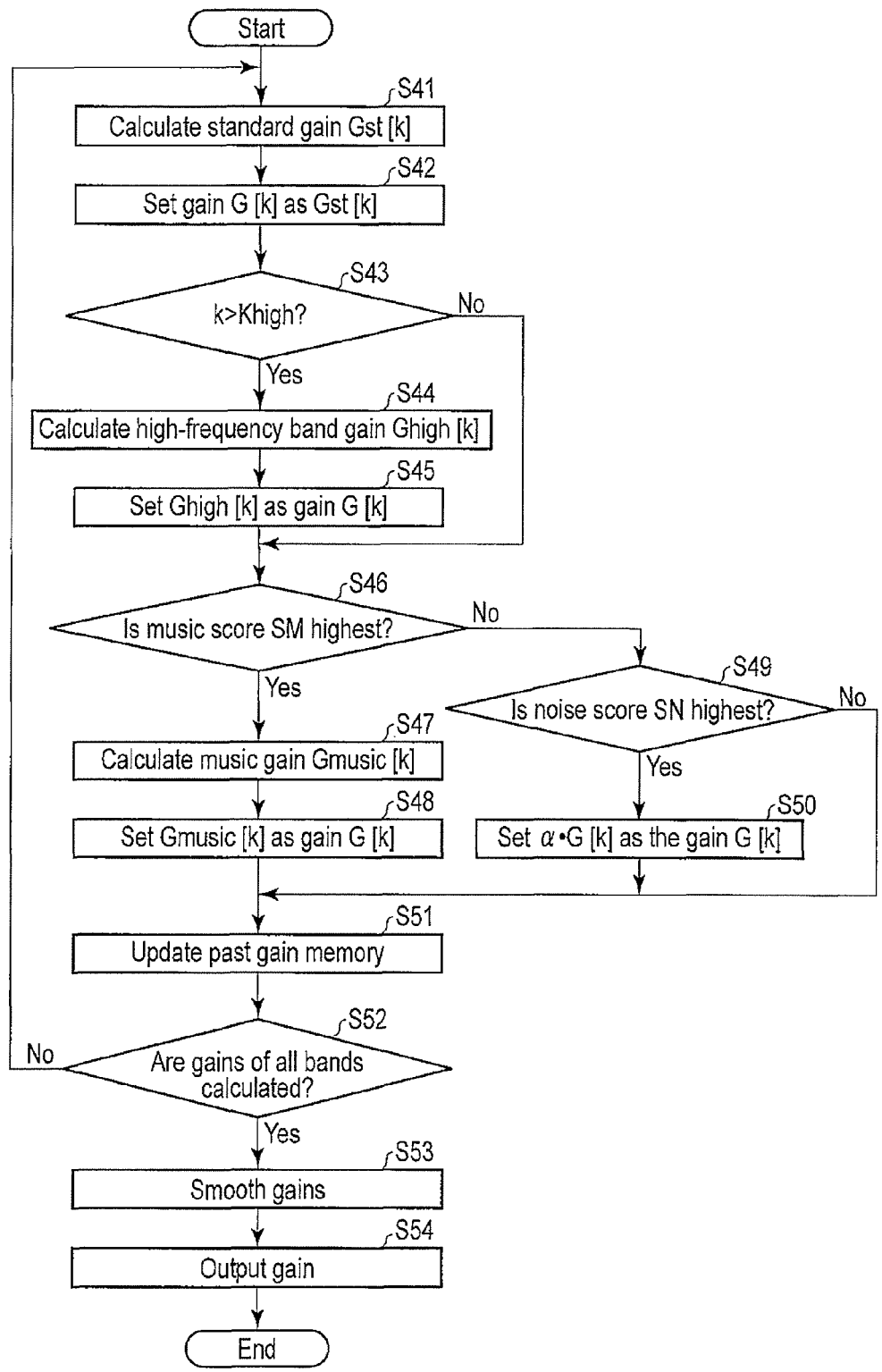
FIG. 8 is an exemplary view showing for explaining processing performed by the audio controller according to the embodiment.

FIG. 8 illustrates an example of operation of the gain controller 280.

The gain controller 280 receives the speech score SS, the music score SM, and the noise score SN supplied from the score calculator 250. The gain controller 280 also receives the masking gain Gm [k] supplied from the masking gain calculator 270. As described above, the masking gain Gm [k] is a gain to correct the frequency band k. A masking gain which is generated by the masking gain calculator 270 based on data of a certain time (frame) t is referred to as "Gm [t][k]".

The masking gain calculator 270 calculates a masking gain Gm [t][k] for each frame. The masking gain calculator 270 successively supplies the calculated masking gains Gm [t][k] to the gain controller 280.

The gain controller 280 includes a memory (gain memory) 285 which stores the masking gains Gm [t][k] successively supplied from the masking gain calculator 270. The gain controller 280 smoothes the gain G [k] in the time-domain, based on the masking gains Gm [t][k] stored in the gain memory.

A standard time interval (or the number of frames) Nst which is used for smoothing is set in advance in the gain controller 280. The standard time interval is simply referred to as "standard interval". The gain controller 280 smoothes the masking gains Gm [t][k] in the standard interval described above, and calculates a standard gain Gst [t][k] (Step S41). The gain controller 280 calculates the standard gain Gst [t][k] by, for example, the following numerical expression 1.

$$G_{st}[t][k] = \sum_{i=0}^{N_{st}-1} (G_m[t-i][k])/N_{st} \qquad \text{[Expression 1]}$$

The gain controller 280 sets the calculated standard gain Gst [t][k] as the gain G [k] (Step S42).

Then, the gain controller 280 performs a gain for high frequency band. The gain controller 280 includes a memory 285 which stores in advance a threshold frequency Khigh to determine whether the frequency is high frequency band or low frequency band. The gain controller 280 determines whether the frequency band k is higher than the threshold frequency Khigh or not (Step S43). When the frequency band k is higher than the threshold frequency Khigh, the gain controller 280 performs processing of correcting the gain of high frequency band (high frequency band gain correction).

Specifically, when the frequency band k is higher than the threshold frequency Khigh, the gain controller 280 smoothes the gain in a time interval Nhigh which is higher than the standard interval Nst, and calculates the high frequency band gain Ghigh (Step S44). The gain controller 280 calculates the high frequency band gain Ghigh [t][k] by, for example, the following numerical expression 2.

$$G_{high}[t][k] = \sum_{i=0}^{N_{high}-1} (G_m[t-i][k])/N_{high} \qquad \text{[Expression 2]}$$

Specifically, the gain controller 280 extracts gains which correspond to the interval Nst and the interval Nhigh, respectively, from the calculated gains which are stored in the gain memory 285, and performs smoothing using the extracted gains.

The gain controller 280 compares the already set gain G [k] with the high frequency band gain Ghigh [t][k]. When the high frequency band gain Ghigh [t][k] is larger than the gain G [k], the gain controller 280 sets the high frequency band gain Ghigh [t][k] as the gain G [k] (Step S45).

As described above, the interval Nhigh which is used for smoothing the high frequency band gain is larger than the standard interval Nst. Thereby, the audio controller 200 can control the gain change such that the high frequency band gain is attenuated more slowly.

Figure 9:
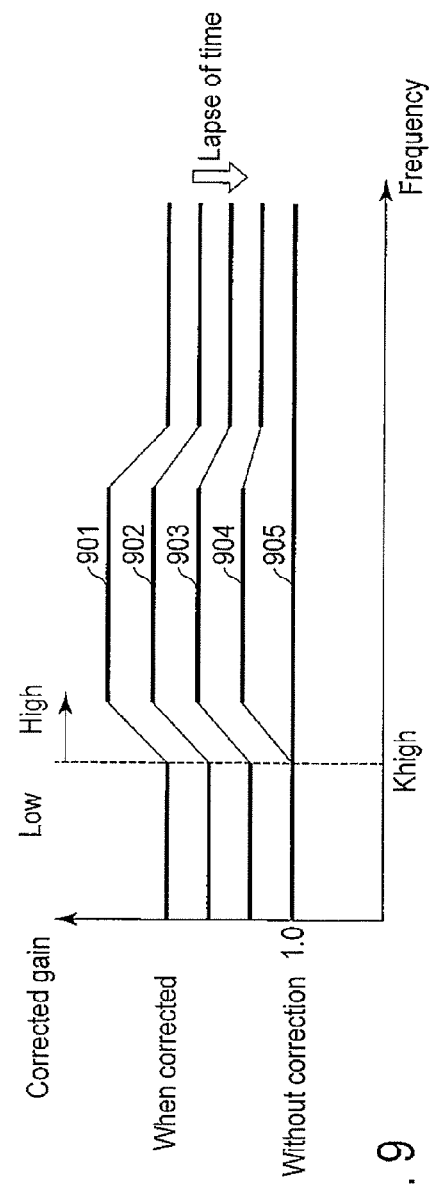
FIG. 9 is an exemplary view showing for explaining processing performed by the audio controller according to the embodiment.

FIG. 9 illustrates an example of the gain G [k] which is supplied from the gain controller 280 to the equalizer 220. Each of graphs 901 to 905 indicates change of the gain G [k] with lapse of time. The graph 901 indicates a gain [k] which is supplied first from the gain controller 280 to the equalizer 220. The graph 902 indicates a gain [k] which is supplied from the gain controller 280 to the equalizer 220 after a fixed time has passed from the time of the graph 901. The graph 903 indicates a gain [k] which is supplied from the gain controller 280 to the equalizer 220 after a fixed time has passed from the time of the graph 902. The graph 904 indicates a gain [k] which is supplied from the gain controller 280 to the equalizer 220 after a fixed time has passed from the time of the graph 903. The graph 905 indicates a gain [k] which is supplied last from the gain controller 280 to the equalizer 220.

According to the example, the standard gain Gst [k] is adopted in frequency bands lower than Khigh, while the high frequency band gain Ghigh [k] is adopted in frequency bands higher than Khigh. As a result, the high frequency band gain is attenuated more slowly than the low frequency band gain.

According to the above structure, for example, when the environmental sound increases, that is, when the masking gain Gm [k] is changed from a small value to a large value, the audio controller 200 adopts the standard gain Gst [k] as the gain G [k]. Thereby, the audio controller 200 can promptly correct the audio signal to follow the environmental sound when the environmental sound increases.

In addition, for example, when the environmental sound decreases, that is, when the masking gain Gm [k] is changed from a large value to a small value, the audio controller 200 adopts the high frequency band gain Ghigh [k] as the high frequency band gain G [k]. Thereby, the audio controller 200 can correct the audio signal such that the audio signal at high frequency band is slowly attenuated. In this case, the audio controller 200 can prevent providing the user with "blur (lack of high frequency component)" caused by rapid attenuation of the sound of high frequency band. As a result, it is possible to provide an audio controlling apparatus, an audio correction apparatus, and an audio correction method, which can realize audio of higher quality.

In addition, the gain controller 280 determines a sound type which is dominant in the audio signal. Specifically, the gain controller 280 determines a sound type which is dominant in the audio signal, based on the speech score SS, the music score SM, and the noise score SN supplied from the score calculator 250.

First, the gain controller 280 determines whether the music score SM is highest or not (Step S46). Specifically, the gain controller 280 compares the speech score SS, the music score MM and the noise score SN, and determines whether the music score SM is highest or not. When it is determined that the music score SM is highest, the gain controller 280 determines that music is dominant. Specifically, the gain controller 280 determines that music is the main component of the audio signal.

When it is determined at Step S46 that music is dominant, the gain controller 280 smoothes the gain in a time interval Nmusic longer than the standard interval Nst and the interval Nhigh, and calculates a music gain Gmusic [t][k] (Step S47). The gain controller 280 calculates the music gain Gmusic [t][k] by, for example, the following numerical expression 3.

$$G_{music}[t][k] = \sum_{i=0}^{N_{music}-1} (G_m[t-i][k])/N_{music} \qquad \text{[Expression 3]}$$

The gain controller 280 compares the already set gain G [k] with the music gain Gmusic [t][k]. When the music gain Gmusic [t][k] is larger than the gain G [k], the gain controller 280 sets the music gain Gmusic [t][k] as the gain G [k] (Step S48).

As described above, the audio controller 200 performs control such that the gain G [k] is changed more slowly, when the environmental sound changes during playback of music. As described above, the audio controller 200 can prevent providing the user with a feeling that something is wrong, which is caused by rapid attenuation of the music level.

When music is not dominant at Step S46, the gain controller 280 determines whether the noise score SN is highest or not (Step S49). Specifically, the gain controller 280 compares the speech score SS, the music score SM, and the noise score SN, and determines whether the noise score SN is highest or not. When it is determined that the noise score SN is highest, the gain controller 280 determines that noise is dominant. Specifically, the gain controller 280 determines that noise is the main component of the audio signal.

When it is determined at Step S49 that noise is dominant, the gain controller 280 multiplies the already calculated gain G [k] by a preset attenuation coefficient α (α<1). The gain controller 280 sets α·G [k] as the gain G [k] (Step S50). Thereby, the audio controller 200 can prevent amplification of noise. The gain controller 280 updates the gain memory (Step S51). Specifically, the gain controller 280 additionally writes the masking gains Gm [t][k] successively supplied from the masking gain calculator 270 in the gain memory.

Then, the gain controller 280 determines whether gains of all the frequency bands are calculated or not (Step S52). When gains of all the frequency bands are not calculated, the gain controller 280 goes to Step S41.

When gains of all the frequency bands are calculated, the gain controller 280 smoothes the gains (Step S53). Specifically, the gain controller 280 smoothes the calculated gains G [k] in the frequency direction. Thereby, the audio controller 200 can prevent projection of the gains between the frequency bands.

The gain controller 280 transmits the smoothed gain G [k] to the equalizer 220 (Step S54). Thereby, the audio controller 220 finishes audio control for one frame.

Although the attenuation time of the gain coefficient is extended by increasing the number of frames for smoothing at Steps S44 and S47 of the present embodiment, the gain coefficient may be calculated by multiplying the gain coefficient G [k] of the previous frame by the attenuation coefficient (which is smaller than 1.0), as the method of extending the attenuation time. The main purpose of the present embodiment is to control the attenuation time for each frequency band, and the same effect can be obtained by controlling (extending) the attenuation time.

For example, the gain controller 280 outputs one of the gain which is calculated by smoothing the masking gain by the time as described above, and the gain which is calculated by multiplying the gain of the previous frame by the attenuation coefficient, to the equalizer 220. For example, the gain controller 280 selects a gain to be outputted, based on an operation or preset information. The gain controller 280 may have only the structure of multiplying the gain of the previous frame by the attenuation coefficient, without the structure of smoothing the masking gain by time.

The audio controller 200 described above performs proper audio control for each frequency band, in accordance with the environmental sound. Thereby, it is possible to prevent the user from perceiving blur. In addition, the audio controller 200 performs proper audio control according to the sound type, and thereby can prevent the user from having a feeling that something is wrong.

Functions described in the above embodiment may be constituted not only with use of hardware but also with use of software, for example, by making a computer read a program which describes the functions. Alternatively, the functions each may be constituted by appropriately selecting either software or hardware.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An audio controlling apparatus audio controlling apparatus comprising:
   a first receiver configured to receive the audio signal;
   a second receiver configured to receive an environmental sound;
   a masking gain calculator configured to calculate a masking gain for each frequency band, based on the audio signal and the environmental sound;
   a gain controller configured to smooth the masking gain of a frequency band that is less than a preset threshold frequency in a first interval, smooth the masking gain of a frequency band that is equal to or higher than the threshold frequency in a second interval that is longer than the first interval, and thereby set a gain to be supplied to an equalizer, the equalizer being configured to correct the audio signal in accordance with a characteristic of the set gain;
   an output module configured to output the gain that is set by the first gain controller to the audio correction module of the audio correction apparatus; and
   a memory configured to store past gains calculated by the gain controller,
   wherein the gain controller is configured to extract from the memory the gains corresponding to the first interval and the second interval, respectively, the extracted gains being used for smoothing the masking gain, and
   wherein the gain controller is configured to calculate a standard gain by smoothing the masking gain, to calculate a high frequency band gain by smoothing the masking gain of the frequency band equal to or higher than the threshold frequency in the second interval, to compare the standard gain with the high frequency band gain for each frequency band, and to adopt the larger value as the set gain.

2. The audio controlling apparatus of claim 1, further comprising:
   a sound type determining module configured to determine a sound type of a main component of the audio signal,
   wherein the gain controller calculates a music gain by smoothing the masking gain in a third interval which is larger than the second interval, when the sound type determining module determines that the sound type of the main component is music.

3. The audio controlling apparatus of claim 2, wherein the gain controller compares the standard gain, the high frequency band gain, and the music gain for each frequency band, and adopts the largest gain as the set gain.

4. The audio controlling apparatus of claim 1, further comprising:
a sound type determining module configured to determine a sound type of a main component of the audio signal,
wherein the gain controller multiplies the gain by a preset attenuation coefficient, when the sound type determining module determines that the sound type of the main component is noise.

5. An audio correction apparatus comprising:
a first receiver configured to receive an audio signal;
a second receiver configured to receive an environmental sound;
a masking gain calculator configured to calculate a masking gain for each frequency band, based on the audio signal and the environmental sound;
a gain controller configured to smooth the masking gain of a frequency band that is less than a preset threshold frequency in a first interval, smooth the masking gain of a frequency band that is equal to or higher than the threshold frequency in a second interval that is longer than the first interval, and thereby set a gain;
an equalizer configured to correct the audio signal, based on the gain that is set by the gain controller; and
an output module configured to output the audio signal that is corrected by the audio correction module,
wherein when the masking gain increases, a standard gain obtained by smoothing the masking gain is used as the set gain so as to correct the audio signal to follow the environmental sound being increased.

6. The audio correction apparatus of claim 5, further comprising:
a microphone configured to detect environmental sound to supply the second receiver with the environmental sound.

7. An audio correction method, comprising:
receiving an audio signal;
receiving an environmental sound;
calculating a masking gain for each frequency band, based on the audio signal and the environmental sound;
smoothing the masking gain of a frequency band that is less than a preset threshold frequency in a first interval, and smoothing the masking gain of a frequency band that is equal to or higher than the threshold frequency in a second interval that is longer than the first interval, to thereby set a gain;
correcting the audio signal based on the set gain; and
outputting the corrected audio signal,
wherein when the masking gain increases, a standard gain obtained by smoothing the masking gain is used as the set gain so as to correct the audio signal to follow the environmental sound being increased.

* * * * *